(12) United States Patent
Cheng (10) Patent No.: US 12,282,404 B2
(45) Date of Patent: Apr. 22, 2025

(54) STORAGE SYSTEM

(71) Applicant: CHANGXIN MEMORY TECHNOLOGIES, INC., Hefei (CN)

(72) Inventor: Weijie Cheng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 109 days.

(21) Appl. No.: 18/151,436

(22) Filed: Jan. 8, 2023

(65) Prior Publication Data

US 2023/0401136 A1  Dec. 14, 2023

Related U.S. Application Data

(63) Continuation of application No. PCT/CN2022/100924, filed on Jun. 23, 2022.

(30) Foreign Application Priority Data

Jun. 8, 2022 (CN) .......................... 202210645145.1

(51) Int. Cl.
*G06F 11/30* (2006.01)
*G06F 11/07* (2006.01)

(52) U.S. Cl.
CPC ...... *G06F 11/3058* (2013.01); *G06F 11/0772* (2013.01); *G06F 11/3034* (2013.01)

(58) Field of Classification Search
CPC ............. G06F 11/3058; G06F 11/0772; G06F 11/3034
See application file for complete search history.

(56) References Cited

U.S. PATENT DOCUMENTS

2016/0162219 A1* 6/2016 Erez .......................... G11C 7/04
                                                      711/103
2019/0161341 A1* 5/2019 Howe ................. B81C 1/00301

FOREIGN PATENT DOCUMENTS

| CN | 106057233 A | 10/2016 |
| CN | 109074831 A | 12/2018 |
| CN | 112905503 A | 6/2021 |

* cited by examiner

*Primary Examiner* — Nadeem Iqbal
(74) *Attorney, Agent, or Firm* — Kilpatrick Townsend & Stockton LLP (57) ABSTRACT

Embodiments provide a storage system, including: a basis chip and memory chips, where the memory chip includes memory cells, the storage system has channels, each of the channels includes a partial number of memory cells in all the memory chips, a partial region of each of the channels corresponds to one memory chip, and each channel is electrically connected to the basis chip; and a temperature processing circuit configured to obtain first temperature codes corresponding to the memory chips, to obtain a second temperature code representing a temperature of the basis chip, and to compare the first temperature codes with the second temperature code to output a high temperature representation code, where the first temperature code represents a maximum temperature in the partial regions of all the channels, and the high temperature representation code is one of the first temperature codes or the second temperature code representing a higher temperature.

11 Claims, 6 Drawing Sheets

STORAGE SYSTEM

CROSS-REFERENCE TO RELATED APPLICATION

This application is a continuation of PCT/CN2022/100924, filed on Jun. 23, 2022, which claims priority to Chinese Patent Application No. 202210645145.1 titled "STORAGE SYSTEM" and filed on Jun. 8, 2022, the entire contents of which are incorporated herein by reference.

TECHNICAL FIELD

Embodiments of the present disclosure relate to the field of semiconductor technology, and more particularly, to a storage system.

BACKGROUND

More and more applications require storage systems with a higher integration level. To meet this need, at least one chip may be placed in an integrated circuit package. A multi-chip package may include a plurality of chips transversely arranged along a same plane, or may include a plurality of chips stacked on top of each other. A high bandwidth memory (HBM) is a new type of central processing unit/graphics processing unit (CPU/GPU) memory chip. That is, a plurality of chips are stacked together to implement a large-capacity and high-bandwidth double data rate (DDR) combined array.

However, an HBM stack is generally very close to a main logic chip or some other accelerator chips in the same package, and therefore has unique thermal constraints. When an operating temperature of the HBM stack exceeds a certain threshold, performance of the HBM stack may be affected due to timing-related issues. Timing margin may tend to decrease as temperature increases, which leads to increase of storage errors. Moreover, as applications continue to perform higher bandwidth operations, number of storage errors may only increase, thereby increasing risk of high-temperature timing conflicts.

SUMMARY

Embodiments of the present disclosure provide a storage system.

The embodiments of the present disclosure provide a storage system, including: a basis chip and a plurality of memory chips, where each of the memory chips includes a plurality of memory cells, the storage system has channels, each of the channels includes a partial number of memory cells in all the memory chips, a partial region of each of the channels corresponds to one memory chip, and each channel is electrically connected to the basis chip; and a temperature processing circuit configured to obtain a plurality of first temperature codes corresponding to the memory chips, to obtain a second temperature code representing a temperature of the basis chip, and to compare the plurality of first temperature codes with the second temperature code to output a high temperature representation code, where the first temperature code represents a maximum temperature in the partial regions of all the channels corresponding to corresponding memory chips, and the high temperature representation code is one of the first temperature codes or the second temperature code representing a higher temperature.

BRIEF DESCRIPTION OF THE DRAWINGS

Exemplary descriptions of one or more embodiments are made by means of pictures in corresponding drawings, and these exemplary descriptions do not constitute a limitation on the embodiments. Unless otherwise stated, the pictures in the drawings do not constitute a scale limitation. Exemplary descriptions are made to one or more embodiments with reference to pictures in the corresponding drawings, and these exemplary descriptions do not constitute limitations on the embodiments. Unless otherwise stated, the figures in the accompanying drawings do not constitute a scale limitation. To describe the technical solutions of the embodiments of the present disclosure or those of the prior art more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Embodiments of the present disclosure provide a storage system, a temperature processing circuit is configured to obtain a maximum temperature in temperatures of all channels in each memory chip and convert the maximum temperature into a first temperature code for output, which facilitates subsequent manual or mechanical detection and control of the temperature of the memory chip. In addition, the temperature processing circuit is further configured to obtain a temperature of a basis chip and convert the temperature into a second temperature code for output, which facilitates subsequent manual or mechanical detection and control of the temperature of the basis chip. In addition, the temperature processing circuit is further configured to output one of the obtained temperature codes representing the higher temperature, to obtain the temperature code corresponding to the region with the highest temperature in all the channels in the storage system, which facilitates subsequent manual or mechanical detection and control of an overall temperature of the storage system, to reduce a risk of high temperature timing conflicts in the storage system.

The embodiments of the present disclosure will be described in detail below in conjunction with the accompanying drawings. However, a person of ordinary skill in the art may understand that in the embodiments of the present disclosure, many technical details are put forward such that a reader may better understand the embodiments of the present disclosure. However, the technical solutions requested to be protected by the embodiments of the present disclosure may also be implemented even without these technical details or various variations and modifications based on the following embodiments.

Figure 1:
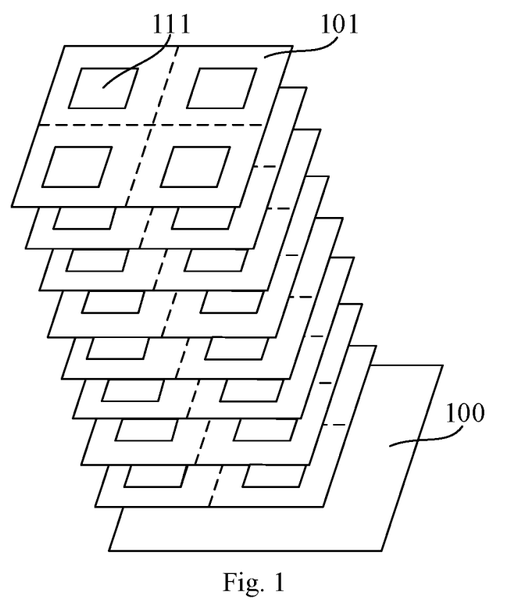
FIG. 1 and FIG. 2 are schematic structural diagrams of a storage system provided by an embodiment of the present disclosure.
Figure 2:
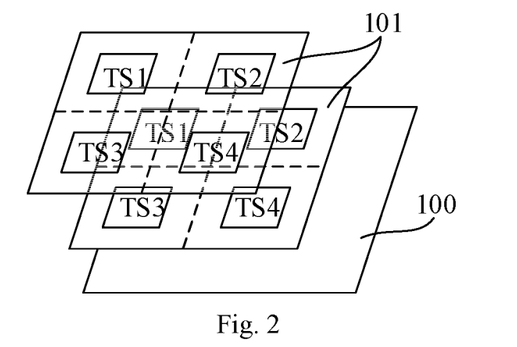
Figure 3:
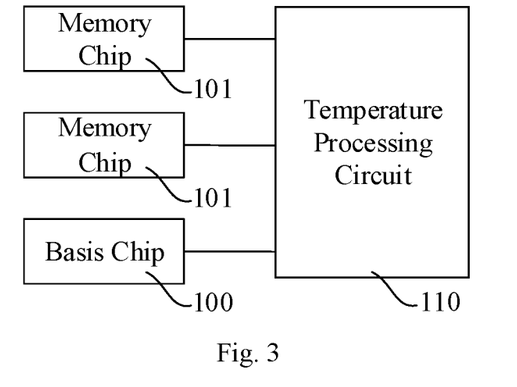
FIGS. 3 to 5 are schematic diagrams of three functional circuits of a storage system provided by an embodiment of the present disclosure.
Figure 4:
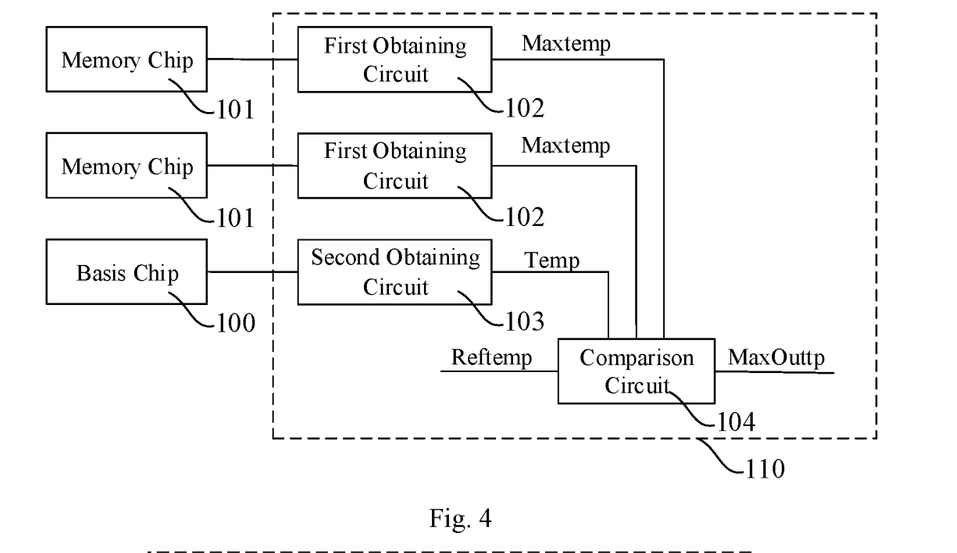
Figure 5:
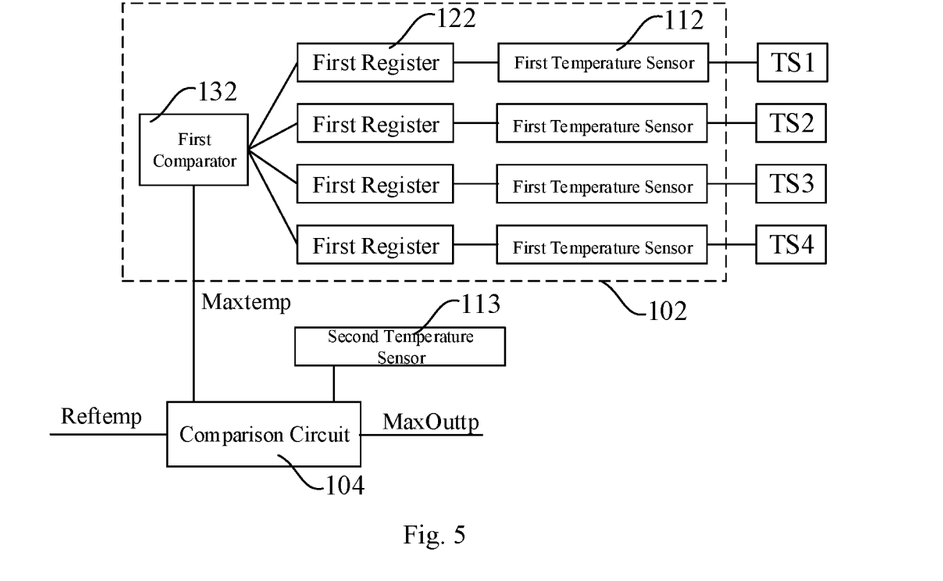
Figure 6:
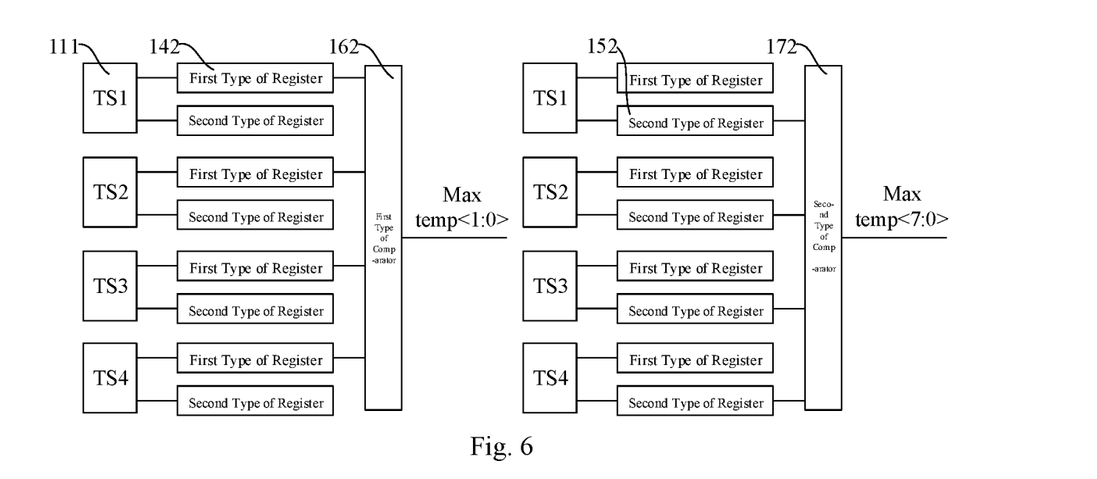
FIG. 6 is a schematic diagram of a functional circuit of a first obtaining circuit in the storage system provided in FIG. 5.
Figure 7:
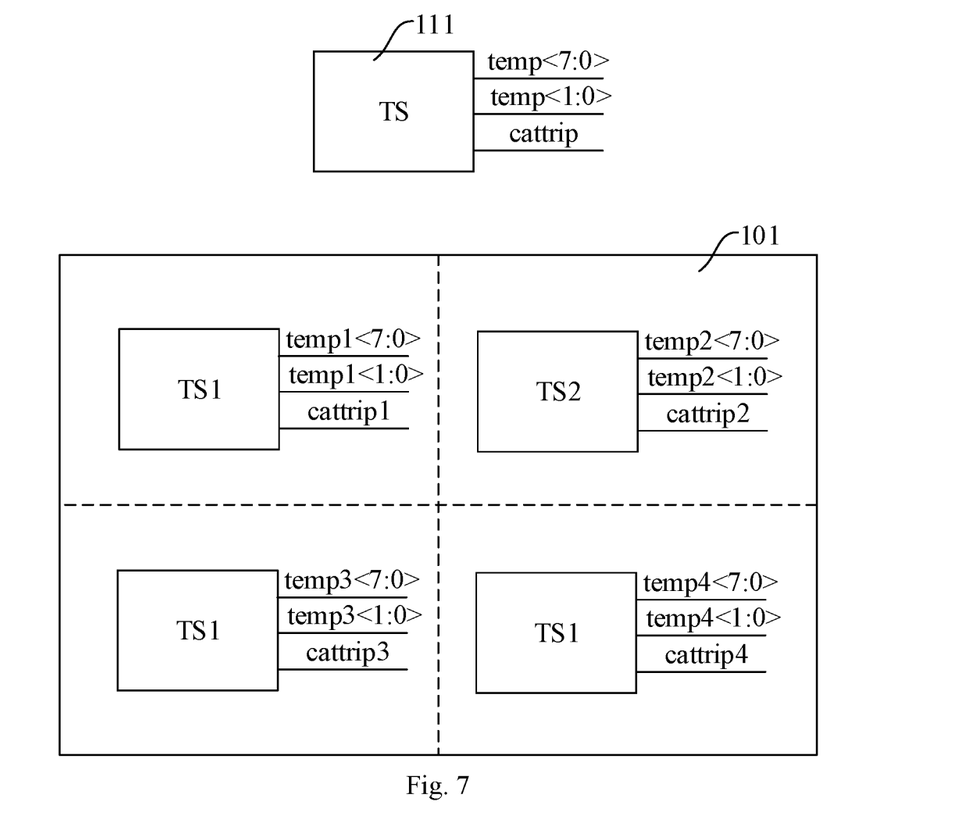
FIG. 7 is a schematic structural diagram of a memory chip in the storage system provided in FIG. 1.
Figure 8:
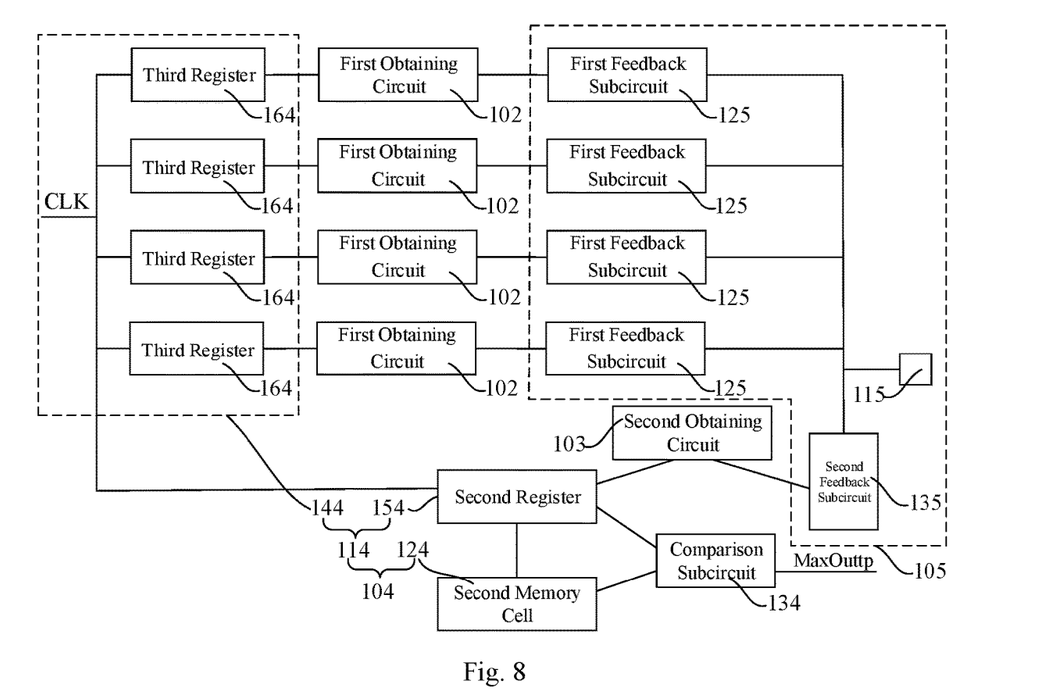
FIGS. 8 to 10 are schematic diagrams of other three functional circuits of a storage system provided by an embodiment of the present disclosure.
Figure 9:
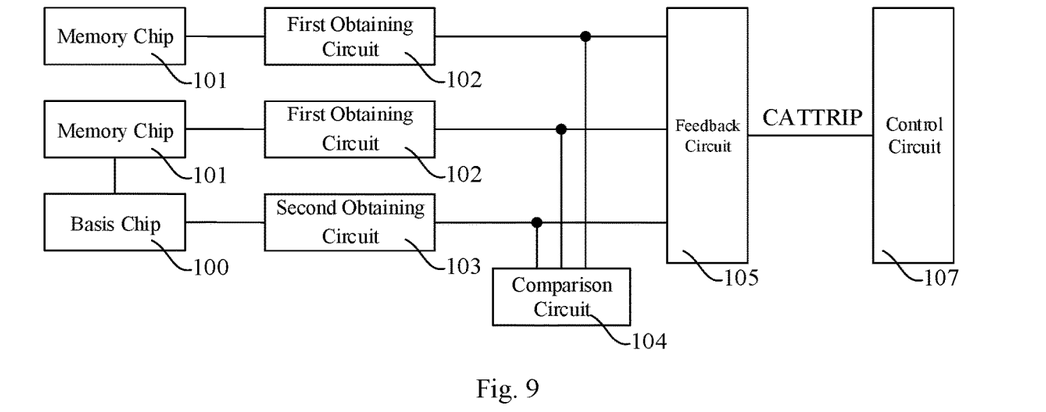
Figure 10:
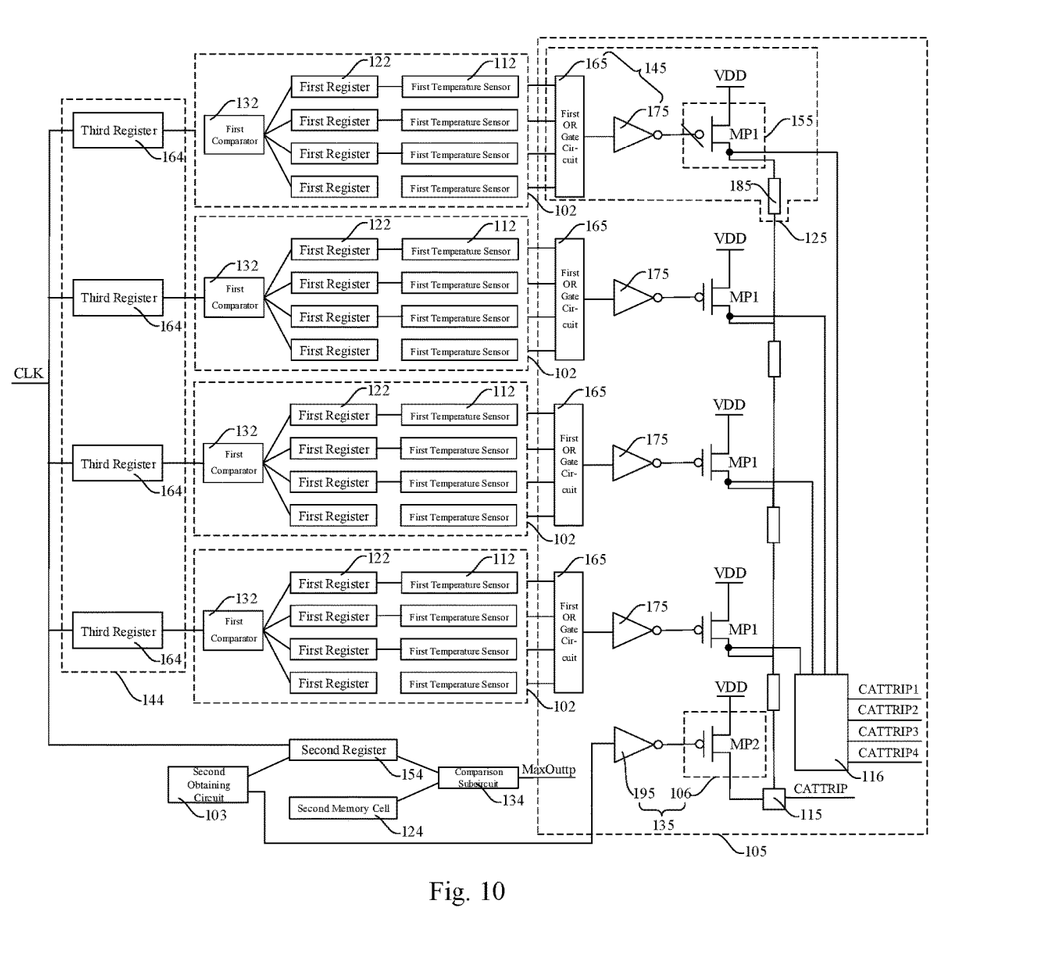
Figure 11:
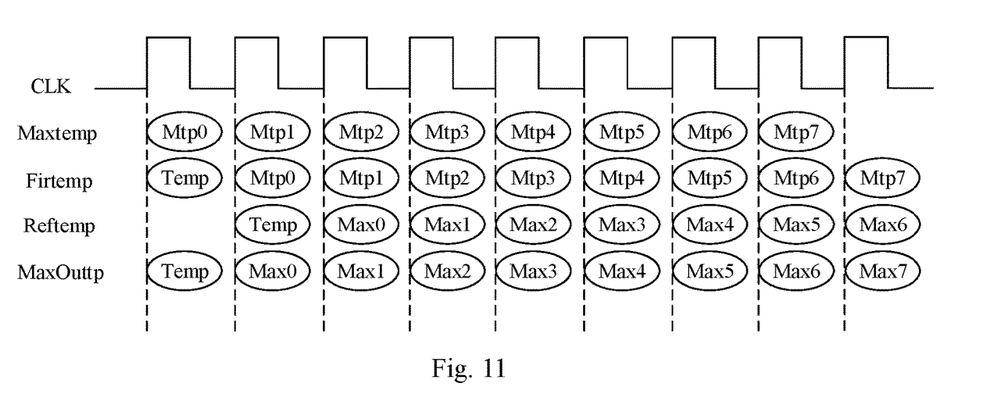
FIG. 11 is a work timing diagram of a storage system provided by an embodiment of the present disclosure.

The embodiments of the present disclosure provide a storage system, and the storage system provided by the embodiments of the present disclosure will be described in detail below with reference to the accompanying drawings. FIG. 1 and FIG. 2 are schematic structural diagrams of the storage system provided by an embodiment of the present disclosure; FIGS. 3 to 5 are schematic diagrams of three functional circuits of the storage system provided by an embodiment of the present disclosure; FIG. 6 is a schematic diagram of a functional circuit of a first obtaining circuit in the storage system provided in FIG. 5; FIG. 7 is a schematic structural diagram of a memory chip in the storage system provided in FIG. 1; FIGS. 8 to 10 are schematic diagrams of other three functional circuits of the storage system provided by an embodiment of the present disclosure; and FIG. 11 is a work timing diagram of the storage system provided by an embodiment of the present disclosure.

Referring to FIGS. 1 to 4, the storage system includes: a basis chip 100 and a plurality of memory chips 101 stacked, and a temperature processing circuit 110. Each of the memory chips 101 includes a plurality of memory cells (not shown in the figures), the storage system has a plurality of channels 111, each of the channels 111 includes a partial number of memory cells in all the memory chips 101, a partial region of each of the channels 111 corresponds to one memory chip 101, and each channel 111 is electrically connected to the basis chip 100. The temperature processing circuit 110 is configured to obtain a plurality of first temperature codes Maxtemp corresponding to the memory chips 101, to obtain a second temperature code Temp representing a temperature of the basis chip 100, and to compare the plurality of first temperature codes Maxtemp with the second temperature code 100 to output a high temperature representation code MaxOuttp, where the first temperature code Maxtemp represents a maximum temperature in the partial regions of all the channels 111 corresponding to corresponding memory chips 101, and the high temperature representation code MaxOuttp is one of the first temperature codes Maxtemp or the second temperature code Temp representing a higher temperature.

In this way, it is beneficial to obtain the temperature code corresponding to a region with the highest temperature in all the channels 111 of the storage system, which facilitates subsequent manual or mechanical detection and control of the overall temperature of the storage system, to reduce the risk of the high-temperature timing conflicts in the storage system.

In some embodiments, referring to FIG. 4, the temperature processing circuit 110 may include: a plurality of first obtaining circuits 102, where each of the plurality of first obtaining circuits 102 corresponds to one of the plurality of memory chips 101, and each of the plurality of first obtaining circuits 102 is configured to obtain and output the first temperature codes Maxtemp corresponding to each of the plurality of memory chips 101; a second obtaining circuit 103 configured to obtain and output the second temperature code Temp representing the temperature of the basis chip 100; and a comparison circuit 104 configured to obtain the second temperature code Temp and sequentially obtain the plurality of first temperature codes Maxtemp outputted by the plurality of first obtaining circuits 102, and to compare each of the plurality of first temperature codes Maxtemp with a reference temperature code Reftemp to output the high temperature representation code MaxOuttp. The high temperature representation code MaxOuttp is the first temperature code Maxtemp or the reference temperature code Reftemp representing the higher temperature, where the reference temperature code Reftemp is a temperature code obtained by the comparison circuit 104 previous time or a temperature code obtained by the comparison circuit 104 next time, representing the higher temperature, and the temperature code is the first temperature code Maxtemp or the second temperature code Temp.

It is to be understood that when the temperature of the basis chip 100 needs to be monitored in a certain period of time, the comparison circuit 104 is configured to obtain the second temperature code Temp in the period of time, and the second temperature code Temp representing the highest temperature obtained in the period of time is determined as the reference temperature code Reftemp. In one example, in an initial state of the storage system, that is, when the memory chip 101 in the storage system has not started to access data to work, the reference temperature code Reftemp may be the second temperature code Temp, and subsequently after the memory chip 101 in the storage system works for a period of time, a temperature of the partial region of the channel 111 positioned in the basis chip 100 at this moment may be obtained by means of the comparison circuit 104. When the temperature of the memory chip 101 needs to be monitored in other period of time, the comparison circuit 104 is configured to sequentially obtain the plurality of first temperature codes Maxtemp outputted by the plurality of first obtaining circuits 102 in the other period of time, each first temperature code Maxtemp is compared with the reference temperature code Reftemp by means of the comparison circuit 104, the high temperature representation code MaxOuttp is outputted, and it is determined whether the partial region of the channel 111 positioned in the basis chip 100 or the memory chip 101 in the storage system is in a high-temperature state according to the high temperature representation code MaxOuttp, to implement monitoring of the temperature of the channel in the storage system.

It should be noted that in FIG. 1, there is shown an example where eight memory chips 101 are stacked on the basis chip 100 at a time, and each memory chip 101 includes partial regions of four channels 111; FIG. 2 is the schematic structural diagram of the partial regions in FIG. 1; and in FIG. 2, there is shown an example where the storage system includes four channels 111, and the four channels 111 are the first channel TS1, the second channel TS2, the third channel TS3, and the fourth channel TS4 in sequence. In practical application, number of the memory chips 101 stacked on the basis chip 100 is not limited, and number of the channels 111 included in the storage system is also not limited. In addition, for any channel 111, it includes a partial number of memory cells in all the memory chips 101, such that data transmission between the adjacent memory chips 101 is implemented by means of the channel 111. That is, the partial region of each channel 111 corresponds to a memory chip 101. Because working states of different memory chips 101 at the same moment are not necessarily the same, for a certain channel 111, temperatures of different partial regions of the channel 111 positioned in different memory chips 101 are not necessarily the same, and the temperature of the partial region of the channel 111 corresponding to each memory chip 101 needs to be monitored.

In some embodiments, the reference temperature code Reftemp may be an external code received by the comparison circuit 104. That is, the reference temperature code Reftemp is provided by other circuits, and in some other embodiments, the reference temperature code Reftemp may also be a code set inside the comparison circuit 104.

In some embodiments, referring to FIG. 5, each first obtaining circuit 102 may include: a plurality of first temperature sensors 112, where each of the plurality of first temperature sensors 112 is configured to detect a temperature of each of the plurality of channels 111 in the memory chip 101; a plurality of first registers 122, where each of the plurality of first registers 122 is connected to a corresponding first temperature sensor 112, and the plurality of first registers 122 are configured to store code values representing the temperatures of the plurality of channels 111; and a first comparator 132 connected to the comparison circuit 104, where the first comparator 132 is configured to compare the code values stored in the plurality of first registers 122 and output the first temperature code Maxtemp.

It is to be understood that in the same memory chip 101, the memory cells in the memory chip 101 included in different channels 111 are positioned in different regions. That is, at the same moment, it cannot be determined which regions where the memory cells are positioned in the memory chip 101 are accessing the data and which regions where the memory cells are positioned are in a non-working state. Therefore, the corresponding first temperature sensor 112 needs to be arranged for each channel 111 in the memory chip 101 to accurately monitor the temperature of each channel 111.

In addition, each first register 122 corresponds to a channel 111 in the memory chip 101 to store the code value representing the temperature of the corresponding channel 111, then the code values stored in the plurality of first registers 122 in the memory chip 101 are compared by means of the comparison circuit 104, and the code value representing the highest temperature in the code values is outputted as the first temperature code Maxtemp, such that the first temperature code Maxtemp represents the maximum temperature in the partial regions of all the channels 111 corresponding to the corresponding memory chips 101.

In some embodiments, referring to FIG. 6 and FIG. 7, the plurality of first registers 122 (referring to FIG. 5) may include: first type of registers 142 configured to store the first code values temp<1:0> representing the temperatures of the plurality of channels 111, where each of the first code values temp<1:0> has two bits; and second type of registers 152 configured to store second code values temp<7:0> representing the temperatures of the plurality of channels 111, where each of the second code values temp<7:0> has eight bits.

It is to be understood that the code value, representing the temperature of the channel 111, stored in the first register 122 may include two types, i.e., the first code value temp<1:0> and the second code value temp<7:0>. So the subsequently outputted first temperature code Maxtemp may also include two types, i.e., Maxtemp<1:0> and Maxtemp<7:0>. The first comparator 132 (referring to FIG. 5) may include a first type of comparator 162 and a second type of comparator 172, where the first type of comparator 162 is configured to compare the first code values temp<1:0> stored in the plurality of first registers 122 and output Maxtemp<1:0>, and the second type of comparator 172 is configured to compare the second code values temp<7:0> stored in the plurality of first registers 122 and output Maxtemp<7:0>.

It should be noted that the second temperature code Temp, corresponding to the basis chip 100, obtained by the second obtaining circuit 103 may also include: the third code value (not shown in figure) representing the temperature of the partial region of the channel 111 positioned in the basis chip 100, where the third code value has two bits; and the fourth code value (not shown in figure) representing the temperature of the partial region of the channel 111 positioned in the basis chip 100, where the fourth code value has eight bits.

In addition, the reference temperature code Reftemp correspondingly also includes the first reference temperature code having two bits and the second reference temperature code having eight bits, and the high temperature representation code MaxOuttp correspondingly also includes the first high temperature representation code having two bits and the second high temperature representation code having eight bits. The comparison circuit 104 is configured to: compare the maximum of the first code value temp<1:0> in a certain memory chip 101 with the first reference temperature code to output the first high temperature representation code, where the first reference temperature code is the two-bit temperature code obtained by the comparison circuit 104 previous time or the two-bit temperature code obtained by the comparison circuit next time, representing the higher temperature, and the two-bit temperature code is the first temperature code Maxtemp<1:0> or the third code value. It should be noted that the maximum of the plurality of first code values temp<1:0> in a certain memory chip 101 is the first temperature code Maxtemp<1:0>.

In addition, the comparison circuit 104 is further configured to: compare the maximum of the second code value temp<7:0> in a certain memory chip 101 with the second reference temperature code to output the second high temperature representation code, where the second reference temperature code is the eight-bit temperature code obtained by the comparison circuit 104 previous time or the eight-bit temperature code obtained by the comparison circuit next time, representing the higher temperature, and the eight-bit temperature code is the first temperature code Maxtemp<7:0> or the fourth code value. It should be noted that the maximum of the plurality of second code values temp<7:0> in a certain memory chip 101 is the first temperature code Maxtemp<7:0>.

It should be noted that in FIG. 7, there is shown an example where any channel 111 in the memory chip 101 is denoted by TS, the first code value corresponding to any channel 111 is temp<1:0>, and the second code value corresponding to any channel 111 is temp<7:0>; and in FIG. 7, there is shown an example where the memory chip 101 includes four channels 111, which are the first channel TS1, the second channel TS2, the third channel TS3, and the fourth channel TS4. Moreover, the first code value corresponding to the first channel TS1 is temp1<1:0>, and the second code value corresponding to the first channel TS1 is temp1<7:0>; the first code value corresponding to the second channel TS2 is temp2<1:0>, and the second code value corresponding to the second channel TS2 is temp2<7:0>; the first code value corresponding to the third channel TS3 is temp3<1:0>, and the second code value corresponding to the third channel TS3 is temp3<7:0>; and the first code value corresponding to the fourth channel TS4 is temp4<1:0>, and the second code value corresponding to the fourth channel TS4 is temp4<7:0>.

In some embodiments, with continued reference to FIG. 5, the second obtaining circuit 103 (referring to FIG. 4) may include a second temperature sensor 113 connected to the comparison circuit 104, where the second temperature sensor 113 is configured to detect the temperature of the basis chip 100. In this way, after the second obtaining circuit 103 obtains the temperature of the basis chip 100 by means of the second temperature sensor 113, the second temperature code Temp may be outputted based on the obtained temperature of the basis chip 100.

In some embodiments, with reference to FIG. 4 and FIG. 8, the comparison circuit 104 may include: a first memory cell 114 configured to obtain and store the second temperature code Temp, or to sequentially obtain and store the plurality of first temperature codes Maxtemp in response to a trigger signal CLK; a second memory cell 124 configured to store the reference temperature code Reftemp, where in the initial state, the reference temperature code Reftemp is the second temperature code Temp; and a comparison subcircuit 134 configured to compare the plurality of first temperature codes Maxtemp in the first memory cell 114 with the reference temperature code Reftemp, or to compare the second temperature code Temp in the first memory cell 114 with the reference temperature code Reftemp, and to update the reference temperature code Reftemp in the second memory cell 124. The updated reference temperature code Reftemp is the temperature code obtained by the first memory cell 114 previous time or the temperature code obtained by the first memory cell 114 next time, representing the higher temperature.

It is to be understood that the temperature code is the first temperature code Maxtemp or the second temperature code Temp. In one example, in the initial state of the storage system, after obtaining and storing the second temperature code Temp, the first memory cell 114 transmits the second temperature code Temp to the second memory cell 124, such that the reference temperature code Reftemp is the second temperature code Temp. Subsequently, the memory chip 101 in the storage system starts to access the data, and the first memory cell 114 starts to sequentially obtain and store the first temperature codes Maxtemp in response to the trigger signal CLK. For example, the first memory cell 114 sequentially obtains the first temperature codes Maxtemp outputted by the plurality of first obtaining circuits 102 in response to a rising edge of the trigger signal CLK. That is, the first memory cell 114 obtains, at each rising edge, a first temperature code Maxtemp outputted by a first obtaining circuit 102, and transmits the first temperature code Maxtemp to the comparison subcircuit 134, such that the comparison subcircuit 134 compares the first temperature code Maxtemp with the reference temperature code Reftemp. When the temperature represented by the first temperature code Maxtemp is higher than the reference temperature code Reftemp, the reference temperature code Reftemp in the second memory cell 124 is replaced with the first temperature code Maxtemp received by the comparison subcircuit 134 this time. When the temperature represented by the first temperature code Maxtemp is not higher than the reference temperature code Reftemp, the reference temperature code Reftemp in the second memory cell 124 is not replaced, such that the update of the reference temperature code Reftemp in the second memory cell 124 is implemented, thereby ensuring that the updated reference temperature code Reftemp is the temperature code obtained by the first memory cell 114 previous time or the temperature code obtained by the first memory cell 114 next time, representing the higher temperature. It is to be noted that in practical applications, the first memory cell 114 may also sequentially obtain the first temperature codes Maxtemp outputted by the plurality of first obtaining circuits 102 in response to a clock falling edge of the trigger signal CLK. That is, the first memory cell 114 obtains, at each clock falling edge, a first temperature code Maxtemp outputted by a first obtaining circuit 102, and transmits the first temperature code Maxtemp to the comparison subcircuit 134.

In some embodiments, referring to FIG. 4 and FIG. 8, the first memory cell 114 may include a shift register 144 and a second register 154. The shift register 144 is configured to receive the plurality of first temperature codes Maxtemp, to sequentially transmit the plurality of first temperature codes Maxtemp to the second register 154 in response to the trigger signal CLK, and to transmit one of the plurality of first temperature codes Maxtemp to the second register 154 each time. The second register 154 is configured to receive the plurality of first temperature codes Maxtemp transmitted by the shift register 144, or to receive the second temperature code Temp. In this way, the shift register 144 is configured to implement that the first memory cell 114 sequentially obtains the first temperature codes Maxtemp in response to the trigger signal CLK, and the second register 154 is configured to implement that the first memory cell 114 sequentially stores the first temperature codes Maxtemp in response to the trigger signal CLK, or stores the second temperature code Temp.

In some embodiments, with continued reference to FIG. 4 and FIG. 8, the shift register 144 may include a plurality of third registers 164, where each of the plurality of third registers 164 corresponds to a corresponding first obtaining circuit 102. Each of the plurality of third registers 164 is configured to obtain the plurality of first temperature codes Maxtemp, and transmit the plurality of first temperature codes Maxtemp to the second register 154 in response to the trigger signal CLK. It is to be understood that at a rising edge of the trigger signal CLK, a third register 164 is configured to obtain and transmit the first temperature code Maxtemp corresponding to the third register 164. The comparison subcircuit 134 updates the reference temperature code Reftemp again according to the first temperature code Maxtemp obtained each time and the updated reference temperature code Reftemp, to ensure that the reference temperature code Reftemp is one temperature code, representing the highest temperature, among all the temperature codes obtained currently.

In some embodiments, referring to FIG. 9, the storage system may further include a feedback circuit 105 configured to output a high temperature representation signal CATTRIP when the maximum temperature of any one of the plurality of memory chips 101 is higher than or equal to a first trigger temperature, or when the temperature of the basis chip 100 is higher than or equal to a second trigger temperature. In practical application, if the storage system outputs the high temperature representation signal CATTRIP, it represents that the temperature of at least a channel 111 in at least a memory chip 101 or the basis chip 100 of the storage system is higher than the predetermined temperature, which is the first trigger temperature or the second trigger temperature, the storage system may be regarded to be in the hot state, and subsequently the storage system may be cooled to avoid the risk of timing conflicts in the storage system. In one example, the first trigger temperature and/or the second trigger temperature may range from 30° C. to 100° C., such as 40° C., 50° C., 60° C., 70° C., 80° C., 90° C., or higher.

In some embodiments, referring to FIGS. 8 to 10, the feedback circuit 105 may include: an output port 115 configured to output the high temperature representation signal CATTRIP; a plurality of first feedback subcircuits 125, where each of plurality of first feedback subcircuits 125 is connected to the output port 115 and corresponds to a corresponding one of the plurality of first obtaining circuits 102, and each of the plurality of first feedback subcircuits 125 is configured to turn on a transmission path between a power port VDD and the output port 115 when the maximum temperature of each of the plurality of memory chips 101 (referring to FIG. 3) is higher than or equal to the first trigger temperature; and a second feedback subcircuit 135 connected to the output port 115, where the second feedback subcircuit 135 is configured to turn on the transmission path between the power port VDD and the output port 115 when the temperature of the basis chip 100 (referring to FIG. 3) is higher than or equal to the second trigger temperature.

As can be seen, no matter which channel 111 in the memory chip 101 corresponding to the first obtaining circuit 102 is in a high-temperature condition, that is, no matter the maximum temperature of the memory chip 101 is higher than or equal to the first trigger temperature, or the temperature of the basis chip 100 is higher than or equal to the second trigger temperature, the transmission path between the power port VDD and the output port 115 in the feedback circuit 105 may be turned on, and the outputted high temperature representation signal CATTRIP is a high-level signal, which represents that there exists a region having an excessively high temperature in the storage system, and the risk of timing conflicts is higher. In the storage system, when the maximum temperature of the memory chip 101 is lower than the first trigger temperature and the temperature of the basis chip 100 is lower than the second trigger temperature, the transmission path between the power port VDD and the output port 115 in the feedback circuit 105 may not be turned on. In this case, the outputted high temperature representation signal CATTRIP is a low-level signal, which represents that there is no region having the excessively high temperature in the storage system, and the risk of timing conflicts is lower.

It is to be noted that FIG. 8 and FIG. 10 only illustrate a connection relationship between the first obtaining circuit 102 and the second obtaining circuit 103 corresponding to four memory chips 101, the comparison circuit 104, and the feedback circuit 105. In practical applications, number of the memory chips 101 is not limited.

In some embodiments, referring to FIG. 10, the first feedback subcircuit 125 may include: a first logic circuit 145 connected to one of the plurality of first obtaining circuits 102; and a first switch circuit 155. A first terminal and a second terminal of the first switch circuit 155 are respectively connected to the power port VDD and the output port 115, and a first control terminal of the first switch circuit 155 is connected to the first logic circuit 145. When the maximum temperature is higher than or equal to the first trigger temperature, the first logic circuit 145 is configured to output a first control signal to the first control terminal to connect the first terminal to the second terminal.

In one example, with continued reference to FIG. 10, the first logic circuit 145 may include a first OR gate circuit 165 connected to the first obtaining circuit 102 and a first phase inverter 175 connected to an output of the first OR gate circuit 165. When the maximum temperature of at least one channel 111 (referring to FIG. 1) corresponding to the first obtaining circuit 102 is higher than or equal to the first trigger temperature, the at least one temperature representation signal outputted by the first obtaining circuit 102 is a high level, and the first OR gate circuit 165 receives at least one high level to output a high-level signal. When the maximum temperature of at least one channel 111 corresponding to the first obtaining circuit 102 is higher than or equal to the first trigger temperature, the first phase inverter 175 receives the high-level signal outputted by the first OR gate circuit 165 to output a low-level signal, where the low-level signal is the first control signal. The first switch circuit 155 includes a first P-channel metal oxide semiconductor (PMOS) transistor MP1, where a gate of the first PMOS transistor MP1 is the first control terminal, a source of the first PMOS transistor MP1 is the first terminal, and a drain of the first PMOS transistor MP1 is the second terminal. When the maximum temperature of at least one channel 111 corresponding to the first obtaining circuit 102 is higher than or equal to the first trigger temperature, the first PMOS transistor MP1 receives the low-level signal outputted from the first phase inverter 175 to connect the first terminal to the second terminal. The maximum temperature refers to a maximum temperature of the plurality of channels 111 in the same memory chip 101.

It is to be understood that in combination with FIG. 7 and FIG. 10, the first obtaining circuit 102 may output one temperature representation signal to the first logic circuit 145 on the basis of the obtained temperature of each channel 111 in the corresponding memory chip 101. In FIG. 7, any channel 111 in the memory chip 101 is denoted by TS, and the temperature representation signal corresponding to any channel 111 is taken as an example of cattrip, and in FIG. 7, an example is taken where the memory chip 101 includes four channels 111, i.e., a first channel TS1, a second channel TS2, a third channel TS3, and a fourth channel TS4. Moreover, the temperature representation signal corresponding to the first channel TS1 is denoted by cattrip1, the temperature representation signal corresponding to the second channel TS2 is denoted by cattrip2, the temperature representation signal corresponding to the third channel TS3 is denoted by cattrip3, and the temperature representation signal corresponding to the fourth channel TS4 is denoted by cattrip4.

When the temperature of any channel 111 in a certain memory chip 101 is higher than or equal to the first trigger temperature, the output of the temperature representation signal cattrip corresponding to the channel 111 is the high level. It is to be understood that as long as one of the temperature representation signals cattrip1, cattrip2, cattrip3 and cattrip4 is the high level, the first OR gate circuit 165 outputs a high-level signal, and the high-level signal is inverted by the first phase inverter 175 to control the first PMOS transistor MP1 to be turned on, such that the transmission path between the power port VDD and the output port 115 is turned on, and the outputted high temperature representation signal CATTRIP is the high-level signal.

It is to be noted that in FIG. 10, there is only shown an example where the first logic circuit 145 includes the first OR gate circuit 165 and the first phase inverter 175, and the first switch circuit 155 includes the first PMOS transistor MP1. In practical applications, the structure of the first logic circuit 145 and the structure of the first switch circuit 155 are not limited, as long as the first logic circuit 145 outputs the first control signal to the first control terminal when the maximum temperature is higher than or equal to the first trigger temperature, the first terminal and the second terminal of the first switch circuit 155 may be connected to each other. For example, in other embodiments, the first logic circuit includes a first OR gate circuit, and the first switch circuit is a first N-channel metal oxide semiconductor (NMOS) transistor.

With continued reference to FIG. 10, the second terminal may be connected to the output port 115 via at least one resistor 185.

In some embodiments, with continued reference to FIG. 8 and FIG. 10, the second feedback subcircuit 135 may include: a second logic circuit 195 connected to the second obtaining circuit 103; and a second switch circuit 106. A third terminal and a fourth terminal of the second switch circuit 106 are respectively connected to the power port VDD and the output port 115, and a second control terminal of the second switch circuit 106 is connected to the second logic circuit 195. When the temperature of the basis chip 100 is higher than or equal to the second trigger temperature, the second logic circuit 195 is configured to output a second control signal to the second control terminal of the second switch circuit 106 to connect the third terminal to the fourth terminal.

It is to be understood that when the temperature of the basis chip 100 is higher than or equal to the second trigger temperature, the second obtaining circuit 103 may output a temperature representation signal to the second logic circuit 195 on the basis of the obtained temperature of the basis chip 100. It is to be understood that when the temperature of the basis chip 100 is higher than or equal to the second trigger temperature, the temperature representation signal is a high-level signal, and the high-level signal is processed by the second logic circuit 195 to control the second PMOS transistor MP2 to be turned on, such that the transmission path between the power port VDD and the output port 115 is turned on, and the outputted high temperature representation signal CATTRIP is the high-level signal.

In one example, with continued reference to FIG. 10, the second logic circuit 195 includes a second phase inverter connected to the second obtaining circuit 103. When the temperature of the basis chip 100 is higher than or equal to the second trigger temperature, the temperature representation signal outputted by the second obtaining circuit 103 is the high-level signal, the second phase inverter receives the high-level temperature representation signal to output a low-level signal, and the low-level signal is the second control signal. The second switch circuit 106 includes a second PMOS transistor MP2, where a gate of the second PMOS transistor MP2 is the second control terminal, a source of the second PMOS transistor MP2 is the third terminal, and a drain of the second PMOS transistor MP2 is the fourth terminal. When the temperature of the basis chip 100 is higher than or equal to the second trigger temperature, the second PMOS transistor MP2 receives the low-level signal outputted from the second phase inverter to connect the third terminal to the fourth terminal.

It is to be noted that in FIG. 10, there is only shown an example where the second logic circuit 195 includes the second phase inverter, and the second switch circuit 106 includes the second PMOS transistor MP2. In practical applications, the structure of the second logic circuit 195 and the structure of the second switch circuit 106 are not limited, as long as the second logic circuit 195 outputs the second control signal to the second control terminal when the temperature of the basis chip 100 is higher than or equal to the second trigger temperature, the third terminal and the fourth terminal of the second switch circuit 106 may be connected to each other. For example, in other embodiment, the second logic circuit includes the even number of second phase inverters connected in series, and the second switch circuit is the second N-channel metal oxide semiconductor (NMOS) transistor.

In some embodiments, referring to FIG. 9, the storage system may further include a control circuit 107, which is configured to adjust, on the basis of the high temperature representation signal CATTRIP outputted by the feedback circuit 105, a data access frequency of one of the memory chips 101 corresponding to the partial region of one of the plurality of channels 111 (referring to FIG. 1).

It is to be understood that when the high temperature representation signal CATTRIP outputted by the feedback circuit 105 is a high-level signal, the data access frequency of the memory chip 101 with a higher temperature may be reduced by adjusting the data access frequency of the memory chip 101 corresponding to the partial region of the channel 111. That is, by selectively controlling access throttling of the memory chip 101 with a higher temperature to cool the memory chip 101, thereby lowering the risk of timing conflicts during data access of the memory chip 101.

It is to be noted that the storage system provided by the embodiments of the present disclosure may also implement positioning and tracing of the temperature of the channel 111. A detailed description is made below by means of two embodiments.

In some embodiments, with continued reference to FIG. 9 and FIG. 10, the feedback circuit 105 may further include a second output port 116 connected to the output of each of the first feedback subcircuits 125, and the second output port 116 is configured to output the signals outputted by the output terminal of each first feedback subcircuit 125 respectively. In FIG. 10, the signals outputted by the output terminals of the four first feedback subcircuits 125 are denoted by CATTRIP1, CATTRIP2, CATTRIP3 and CATTRIP4. In this way, it may be determined, based on a fact that which signal in CATTRIP1, CATTRIP2, CATTRIP3 and CATTRIP4 is a high-level signal, that the temperature of the memory chip 101 corresponding to this high-level signal is too high, and thus the temperature needs to be adjusted by means of, for example, reducing a data storing frequency of the memory chip 101 or stopping a data access operation of the memory chip 101. For example, when the obtained CATTRIP2 is the high-level signal, this represents that the temperature of at least one channel 111 in the memory chip 101 corresponding to CATTRIP2 is higher than the first trigger temperature. That is, the channel is in a high-temperature state. In this case, the data access frequency of the memory chip 101 may be reduced or the data access operation of the memory chip 101 may be stopped to cool the memory chip 101.

In some other embodiments, under the premise that the first memory cell 114 sequentially obtains the first temperature codes Maxtemp outputted by the plurality of first obtaining circuits 102 in response to the rising edge of the trigger signal CLK, when the high temperature representation code MaxOuttp outputted by the comparison circuit 104 is consistent with the first temperature code Maxtemp outputted by the first memory cell 114 in response to an $N^{th}$ rising edge of the trigger signal CLK, it may be traced back which one of the first obtaining circuits 102 outputs the first temperature code Maxtemp on the basis of the $N^{th}$ rising edge of the trigger signal CLK. In this way, it is known that the temperature of at least one channel 111 in the memory chip 101 corresponding to the first obtaining circuit 102 is higher than the first trigger temperature. That is, the channel is in the high-temperature state. Further, on the basis of comparing the code values of the temperatures of the corresponding channels 111, stored in the plurality of first registers 122 in the memory chip 101, it may also be determined which one of the first registers 122 stores the code value of the first temperature code Maxtemp corresponding to the memory chip 101. Because the first registers 122 are in the one-to-one correspondence with the channels 111, it may be positioned which channel 111 in the memory chip 101 has a temperature higher than the first trigger temperature. In this way, the memory chip 101 may be cooled by reducing the data access frequency of the memory cell included in the channel 111 or stopping the data access operation of the memory cell included in the channel 111.

Temperature monitoring principles of the storage system provided by the embodiments of the present disclosure are described in detail below with reference to FIG. 8 and FIG. 11.

It should be noted that, in FIG. 11, the first obtaining circuit 102 obtains and outputs the first temperature codes Maxtemp, including: Mtp0, Mtp1, Mtp2, Mtp3, Mtp4, Mtp5, Mtp6 and Mtp7, where Mtp0, Mtp1, Mtp2, Mtp3, Mtp4, Mtp5, Mtp6 and Mtp7 respectively correspond to different memory chips 101. The temperature codes Firmtemp stored in the first memory cell 114 include: Temp, Mtp0, Mtp1, Mtp2, Mtp3, Mtp4, Mtp5, Mtp6 and Mtp7. The reference temperature codes Reftemp stored in the second memory cell 124 include: Temp, Max0, Max1, Max2, Max3, Max4, Max5, and Max6. The high temperature representation codes MaxOuttp outputted by the comparison circuit 104 include: Temp, Max0, Max1, Max2, Max3, Max4, Max5, and Max6.

In the initial state of the storage system, when the first memory cell 114 obtains and stores the second temperature code Temp, i.e., the temperature of the basis chip 100, the reference temperature code Reftemp is the second temperature code Temp. In this case, the high temperature representation code MaxOuttp outputted by the comparison circuit 104 is the second temperature code Temp. When the memory chips 101 in the storage system start to access the data subsequently, the first obtaining circuits 102 sequentially obtain and output the first temperature codes Maxtemp in response to the rising edge of the trigger signal CLK, and the first memory cell 114 sequentially obtains and stores the first temperature codes Maxtemp in response to the rising edge of the trigger signal CLK. For example, when the first obtaining circuit 102 obtains and outputs Mtp0 in response to the first rising edge of the trigger signal CLK, and the first memory cell 114 obtains and stores Mtp0 in response to the second rising edge of the trigger signal CLK, the reference temperature code Reftemp is Temp. In this case, the comparison circuit 104 compares the temperature represented by Mtp0 with the temperature represented by Temp, where Mtp0 represents the higher temperature. Moreover, at the second rising edge of the trigger signal CLK, the comparison circuit 104 outputs Max0 as the high temperature representation code MaxOuttp; and at the next rising edge, the comparison circuit 104 transmits Max0 to the second memory cell 124 as the updated reference temperature code Reftemp.

In this way, when the first obtaining circuit 102 obtains and outputs Mtp1 in response to the second rising edge of the trigger signal CLK, and the first memory cell 114 obtains and stores Mtp1 in response to the third rising edge of the trigger signal CLK, the reference temperature code Reftemp is Max0; the comparison circuit 104 compares the temperature represented by Mtp1 with the temperature represented by Max0, where Mtp1 or Max0 representing the higher temperature serves as Max1; and the comparison circuit 104, at the third rising edge of the trigger signal CLK, outputs Max1 as the high temperature representation code MaxOuttp, and the comparison circuit 104, at the next rising edge, transmits Max1 to the second memory cell 124 as the updated reference temperature code Reftemp. By analogy, when the first obtaining circuit 102 obtains and outputs Mtp7 in response to the eighth rising edge of the trigger signal CLK, and the first memory cell 114 obtains and stores Mtp7 in response to the ninth rising edge of the trigger signal CLK, the reference temperature code Reftemp is Max6. In this case, the comparison circuit 104 compares the temperature represented by Mtp7 and the temperature represented by Max6, where Mtp7 represents the higher temperature. Moreover, at the ninth rising edge of the trigger signal CLK, the comparison circuit 104 outputs Max7 as the high temperature representation code MaxOuttp.

It is to be noted that the first register 122 in the first obtaining circuit 102 may be assembled in the memory chip 101 corresponding to the first register 122 without adversely affecting the normal data access of the memory chip 101. In practical applications, any one of the first register 122 and the first comparator 132 may be integrated in the basis chip 100, or integrated in the storage system independently of the memory chip 101 and the basis chip 100. Similarly, the third register 164 in the comparison circuit 104 may be assembled in the memory chip 101 corresponding to the third register 164 without adversely affecting the normal data access of the memory chip 101. In practical applications, any one of the third register 164, the second register 154, the second memory cell 124, and the comparison subcircuit 134 may be integrated in the basis chip 100, or integrated in the storage system independently of the memory chip 101 and the basis chip 100. Similarly, the first feedback subcircuit 125 in the feedback circuit 105 may be assembled in the memory chip 101 corresponding to the first feedback subcircuit 125 without adversely affecting the normal data access of the memory chip 101. In practical applications, any one of the first feedback subcircuit 125, the second feedback subcircuit 135, the output port 115, and the second output port 116 may be integrated in the basis chip 100, or integrated in the storage system independently of the memory chip 101 and the basis chip 100.

In conclusion, the temperature processing circuit 110 is configured to obtain the maximum temperature in the temperatures of all the channels 111 in each memory chip 101 and convert the maximum temperature into the first temperature code Maxtemp for output, which facilitates subsequent manual or mechanical detection and control of the temperature of the memory chip 101. Moreover, the temperature processing circuit 110 is further configured to obtain a temperature of the basis chip 100 and convert the temperature into the second temperature code Temp for output, which facilitates subsequent manual or mechanical detection and control of the temperature of the basis chip 100. In addition, the temperature processing circuit 110 further compares the plurality of first temperature codes Maxtemp with the second temperature codes Temp, and outputs one of the temperature codes representing a higher temperature, to obtain the temperature code corresponding to the region having the highest temperature in all the channels 111 in the storage system, which facilitates subsequent manual or mechanical detection and control of the overall temperature of the storage system to reduce the risk of high-temperature timing conflicts in the storage system.

Those of ordinary skill in the art can understand that the above-mentioned embodiments are some embodiments for realizing the present disclosure, but in practical applications, various changes may be made to them in form and details without departing from the spirit and scope of the embodiments of the present disclosure. Any person skilled in the art can make their own changes and modifications without departing from the spirit and scope of the embodiments of the present disclosure. Therefore, the protection scope of the embodiments of the present disclosure shall be subject to the scope defined by the claims.

What is claimed is:

1. A storage system, comprising:

a basis chip and a plurality of memory chips stacked, each of the plurality of memory chips comprising a plurality of memory cells, the storage system having a plurality of channels, each of the plurality of channels comprising a partial number of the memory cells in all of the plurality of memory chips, a partial region of each of the plurality of channels corresponding to one of the plurality of memory chips, and each of the plurality of channels being electrically connected to the basis chip; and a temperature processing circuit configured to obtain a plurality of first temperature codes corresponding to the plurality of memory chips, to obtain a second temperature code representing a temperature of the basis chip, and to compare the plurality of first temperature codes with the second temperature code to output a high temperature representation code, wherein the plurality of first temperature codes represent maximum temperatures in the partial regions of all of the plurality of channels corresponding to corresponding ones of the plurality of memory chips, the high temperature representation code being a given one of the plurality of first temperature codes or the second temperature code representing a higher temperature; and, wherein the temperature processing circuit comprises:

a plurality of first obtaining circuits, each of the plurality of first obtaining circuits corresponding to one of the plurality of memory chips, each of the plurality of first obtaining circuits being configured to obtain and output a given one of the plurality of first temperature codes corresponding to each of the plurality of memory chips;

a second obtaining circuit, the second obtaining circuit being configured to obtain and output the second temperature code representing the temperature of the basis chip; and a comparison circuit configured to obtain the second temperature code and sequentially obtain the plurality of first temperature codes outputted by the plurality of first obtaining circuits, and to compare each of the plurality of first temperature codes with a reference temperature code to output the high temperature representation code, the high temperature representation code being the given first temperature code or the reference temperature code representing the higher temperature, wherein the reference temperature code is a temperature code obtained by the comparison circuit previous time or a temperature code obtained by the comparison circuit next time, representing the higher temperature, and the temperature code being the given first temperature code or the second temperature code;

each of the plurality of first obtaining circuits comprises:

a plurality of first temperature sensors, each of the plurality of first temperature sensors being configured to detect a temperature of each of the plurality of channels in a given one of the plurality of memory chips;

a plurality of first registers, each of the plurality of first registers being connected to a corresponding one of the plurality of first temperature sensors, the plurality of first registers being configured to store code values representing the temperatures of the plurality of channels; and a first comparator connected to the comparison circuit, the first comparator being configured to compare the code values stored in the plurality of first registers and output the given first temperature code; wherein the plurality of first registers comprise: first type of registers configured to store first code values representing the temperatures of the plurality of channels, each of the first code values having two bits; and second type of registers configured to store second code values representing the temperatures of the plurality of channels, each of the second code values having eight bits;

wherein the comparison circuit comprises:

a first memory cell configured to obtain and store the second temperature code, or to sequentially obtain and store the plurality of first temperature codes in response to a trigger signal;

a second memory cell configured to store the reference temperature code, wherein in an initial state, the reference temperature code is the second temperature code; and a comparison subcircuit configured to compare the plurality of first temperature codes in the first memory cell with the reference temperature code, or to compare the second temperature code in the first memory cell with the reference temperature code, and to update the reference temperature code in the second memory cell, the updated reference temperature code being the temperature code obtained by the first memory cell previous time or the temperature code obtained by the first memory cell next time, representing the higher temperature; and wherein the first memory cell comprises:

a shift register and a second register, the shift register being configured to receive the plurality of first temperature codes, to sequentially transmit the plurality of first temperature codes to the second register in response to the trigger signal, and to transmit one of the plurality of first temperature codes to the second register each time; and wherein the second register is configured to receive the plurality of first temperature codes transmitted by the shift register, or to receive the second temperature code.

2. The storage system according to claim 1, wherein the second obtaining circuit comprises:

a second temperature sensor connected to the comparison circuit, the second temperature sensor being configured to detect the temperature of the basis chip.

3. The storage system according to claim 1, wherein the shift register comprises:

a plurality of third registers, each of the plurality of third registers corresponding to a corresponding one of the plurality of first obtaining circuits, each of the plurality of third registers being configured to obtain the plurality of first temperature codes, and transmit the plurality of first temperature codes to the second register in response to the trigger signal.

4. The storage system according to claim 1, further comprising:

a feedback circuit configured to output a high temperature representation signal when the maximum temperature of any one of the plurality of memory chips is higher than or equal to a first trigger temperature, or when the temperature of the basis chip is higher than or equal to a second trigger temperature.

5. The storage system according to claim 4, wherein the feedback circuit comprises:

an output port, the output port being configured to output the high temperature representation signal;

a plurality of first feedback subcircuits, each of plurality of first feedback subcircuits being connected to the output port and corresponding to a corresponding one of the plurality of first obtaining circuits, each of the plurality of first feedback subcircuits being configured to turn on a transmission path between a power port and the output port when the maximum temperature of each of the plurality of memory chips is higher than or equal to the first trigger temperature; and a second feedback subcircuit connected to the output port, the second feedback subcircuit being configured to turn on the transmission path between the power port and the output port when the temperature of the basis chip is higher than or equal to the second trigger temperature.

6. The storage system according to claim 5, wherein each of the plurality of first feedback subcircuits comprises:
a first logic circuit connected to a given one of the plurality of first obtaining circuits; and
a first switch circuit, a first terminal and a second terminal of the first switch circuit being respectively connected to the power port and the output port, a first control terminal of the first switch circuit being connected to the first logic circuit, wherein when the maximum temperature is higher than or equal to the first trigger temperature, the first logic circuit is configured to output a first control signal to the first control terminal to connect the first terminal to the second terminal.

7. The storage system according to claim 6, wherein the first logic circuit comprises:
a first OR gate circuit connected to the given first obtaining circuit, the first OR gate circuit being configured to output a high-level signal when the maximum temperature is higher than or equal to the first trigger temperature; and
a first phase inverter connected to an output of the first OR gate circuit;
wherein the first switch circuit comprises:
a first P-channel metal oxide semiconductor (PMOS) transistor, a gate of the first PMOS transistor being the first control terminal, a source of the first PMOS transistor being the first terminal, a drain of the first PMOS transistor being the second terminal.

8. The storage system according to claim 6, wherein the second terminal is connected to the output port via at least one resistor.

9. The storage system according to claim 5, wherein the second feedback subcircuit comprises:
a second logic circuit connected to the second obtaining circuit; and
a second switch circuit, a third terminal and a fourth terminal of the second switch circuit being respectively connected to the power port and the output port, a second control terminal of the second switch circuit being connected to the second logic circuit, wherein when the temperature of the basis chip is higher than or equal to the second trigger temperature, the second logic circuit is configured to output a second control signal to the second control terminal of the second switch circuit to connect the third terminal to the fourth terminal.

10. The storage system according to claim 9, wherein the second logic circuit comprises:
a second phase inverter connected to the second obtaining circuit, the second phase inverter being configured to output a low-level signal when the temperature of the basis chip is higher than or equal to the second trigger temperature;
wherein the second switch circuit comprises:
a second PMOS transistor, a gate of the second PMOS transistor being the second control terminal, a source of the second PMOS transistor being the third terminal, and a drain of the second PMOS transistor being the fourth terminal.

11. The storage system according to claim 4, further comprising:
a control circuit configured to adjust a data access frequency of a given one of the plurality of memory chips corresponding to the partial region of a given one of the plurality of channels on a basis of the high temperature representation signal outputted by the feedback circuit.

* * * * *